United States Patent [19]

Seki et al.

[11] Patent Number: 4,565,588
[45] Date of Patent: Jan. 21, 1986

[54] METHOD FOR DIFFUSION OF IMPURITIES

[75] Inventors: Yasukazu Seki, Tokyo; Noritada Sato, Yokosuka, both of Japan

[73] Assignee: Fuji Electric Corporate Research and Development Ltd., Japan

[21] Appl. No.: 659,360

[22] Filed: Oct. 10, 1984

[30] Foreign Application Priority Data

Jan. 20, 1984 [JP] Japan .................................. 59-8795

[51] Int. Cl.$^4$ .......................................... H01L 21/385
[52] U.S. Cl. ..................................... 148/186; 148/188
[58] Field of Search ............................... 148/188, 186

[56] References Cited

U.S. PATENT DOCUMENTS

| | | | |
|---|---|---|---|
| 3,041,213 | 6/1962 | Anderson et al. | 148/190 X |
| 3,084,079 | 4/1963 | Harrington | 148/188 |
| 3,514,348 | 5/1970 | Ku | 148/188 |
| 3,576,685 | 4/1971 | Swann et al. | 148/188 X |
| 3,615,943 | 10/1971 | Genser | 148/188 |
| 3,915,766 | 10/1975 | Pollack et al. | 148/188 |
| 4,206,026 | 6/1980 | Briska et al. | 148/188 X |
| 4,360,393 | 11/1982 | Koval | 148/188 X |
| 4,362,766 | 12/1982 | Dannhauser et al. | 148/188 X |

FOREIGN PATENT DOCUMENTS 51968 11/1982 Japan .

Primary Examiner—George T. Ozaki
Attorney, Agent, or Firm—Brumbaugh, Graves, Donohue & Raymond

[57] ABSTRACT

In the particular embodiments of the invention described in the specification, impurities are diffused into a silicon substrate by applying a solution of the impurity to the substrate, drying the substrate and subjecting it to a glow discharge in an inert gas atmosphere at a pressure of 0.2 to 0.7 Torr and a substrate temperature of 300° C. A semiconductor with n-type properties is formed by using phosphoric acid to provide phosphorus as the impurity and a p-type semiconductor is formed by using boric acid to provide boron as the impurity. Impurity depths of less than one $\mu$m are obtained using a solution containing 0.01 parts per 1000 by volume of the impurity.

18 Claims, 3 Drawing Figures

4,565,588

METHOD FOR DIFFUSION OF IMPURITIES

BACKGROUND OF THE INVENTION

This invention relates to methods for diffusing impurities into a semiconductor.

Among the methods heretofore available for diffusing impurities into a semiconductor substrate through the surface thereof is a method in which the semiconductor substrate is immersed in a liquid containing the impurity and then dried and the dried semiconductor substrate is used as a source for the impurity by subjecting it to a thermal diffusion technique in a closed tube as described in Japanese Patent Publication SHO No. 57(1982)-51968. Other methods include the conventional thermal diffusion method and the ion injection method.

In the production of semiconductors, the procedures for diffusing impurities into the semiconductor constitutes one of the important processes. The technique for impurity diffusion may well be said to have reached a fairly high level. For example, the control of the impurity level and the control of impurity diffusion depth are no longer very difficult tasks.

The methods for impurity diffusion which are now in actual use invariably involve a treatment performed at elevated temperatures in the range of 800° to 1200° C. Consequently, they have not been useful for the production of semiconductor devices whose properties are seriously degraded by exposure to such elevated temperatures. Further, any treatment performed at elevated temperatures has the disadvantages that it requires a good deal of time for raising and lowering the temperature, necessitates use of large scale equipment, and consumes a large amount of energy. More recently, the manufacture of MOS devices and three-dimensional devices has reached a point at which these devices require very thin impurity layers. To meet this requirement, the conventional thermal diffusion methods and the ion injection method are not suitable because they produce excessive diffusion depth.

It is an object of the present invention to overcome the aforementioned disadvantages of the prior art.

Another object of the invention is to provide a method which is capable of forming very thin impurity layers at low temperatures with high repeatability.

SUMMARY OF THE INVENTION

These and other objects of the invention are accomplished by dissolving an impurity which is to be diffused into a semiconductor in a liquid of high volatility in which it is highly soluble, immersing the semiconductor in the solution, drying the wet semiconductor, and then exposing the dried semiconductor to an inactive gas plasma at a temperature not exceeding 300° C.

BRIEF DESCRIPTION OF THE DRAWINGS

Further objects and advantages of the invention will be apparent from a reading of the following description in conjunction with the accompanying drawings, in which.

DESCRIPTION OF PREFERRED EMBODIMENTS

Figure 1:
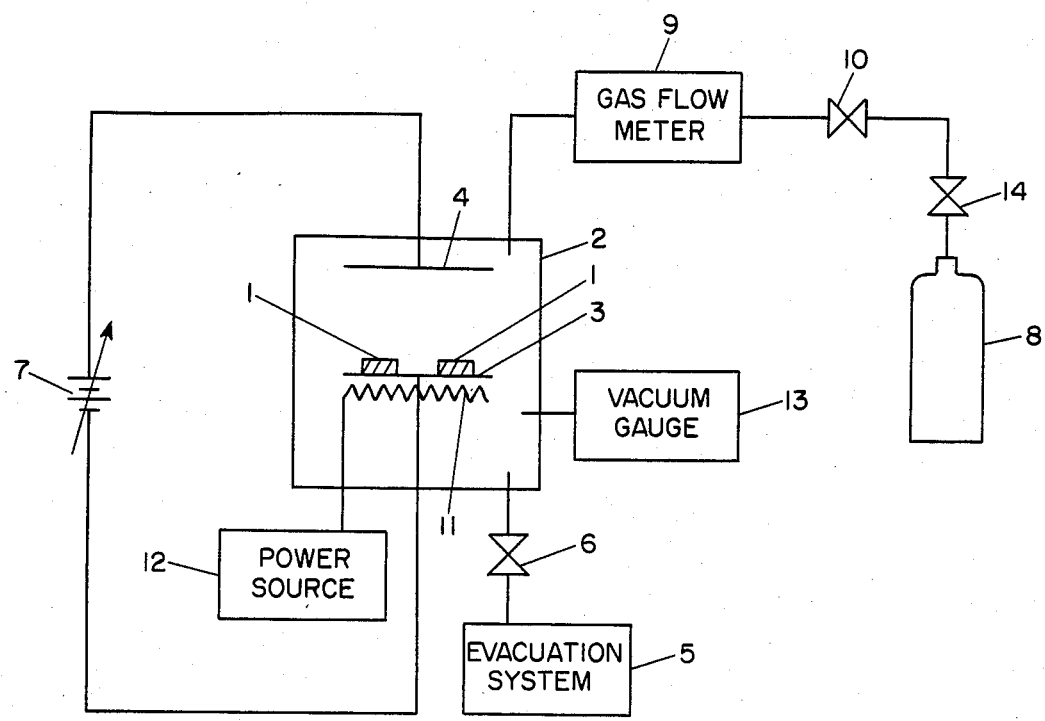
FIG. 1 is a schematic diagram showing a plasma generating apparatus to be used for the diffusion of impurities in accordance with the present invention.

In the schematic diagram of FIG. 1, silicon wafers 1 on which an impurity has been deposited are disposed in a reaction vessel 2 which is connected to an air evacuation system 5, a DC power source 7, and an argon gas cylinder 8.

EXAMPLE 1

Phosphoric acid is used as the source for the impurity. The phosphoric acid is diluted in a high volatility liquid in which it is highly soluble, such as, for example, methyl alcohol, ethyl alcohol, or pure water in a volume ratio of from 0.01/1000 to 10/1000. The silicon wafer is immersed in the solution of phosphoric acid and the wet silicon wafer is then dried. Consequently, the alcohol or water is removed by distillation from the solution of phosphoric acid and a fixed quantity of phosphoric acid is deposited on the silicon wafer. By this method, the impurity can be deposited in a prescribed amount on the silicon wafer. For example, a solution containing about 0.07 cc of phosphoric acid is deposited on one silicon wafer 40 mm in diameter and 300 $\mu$m in thickness.

Then, the silicon wafer 1 is mounted on a lower electrode plate 3 inside the reaction vessel 2 as illustrated in FIG. 1. Using the evacuation system 5, the interior of the reaction vessel 2 is evacuated to less than $10^{-6}$ Torr. A heater 11, connected to a power source 12, heats the lower electrode plate 3 to 300° C. Thereafter, argon gas from the cylinder 8 is supplied through a pressure reducer 14, a gas flow volume regulating valve 10 and a gas flow meter 9 into the reaction vessel 2. The rate at which air is withdrawn is adjusted by an adjusting valve 6 and the internal pressure of the reaction vessel is monitored by vacuum gauge 13 so as to fall within the range from 0.2 to 0.7 Torr. A potential of 400 to 1000 V from the DC power source 7 is applied between the upper electrode plate 4 and the lower electrode plate 3 to generate a glow discharge between the two electrodes 3 and 4. As a result, phosphorus is diffused into the silicon wafer. The reason for this diffusion of phosphorus is not yet understood. The diffusion, however, might be logically explained by assuming that, because an extremely powerful electric field is generated directly above the lower electrode plate 3 and the silicon wafer 1 mounted thereon is exposed to an argon plasma, the $Ar^+$ ions act upon the surface of the silicon wafer and cause the phosphorus adhering to the surface of the silicon wafer to be diffused into the silicon wafer.

Figure 2:
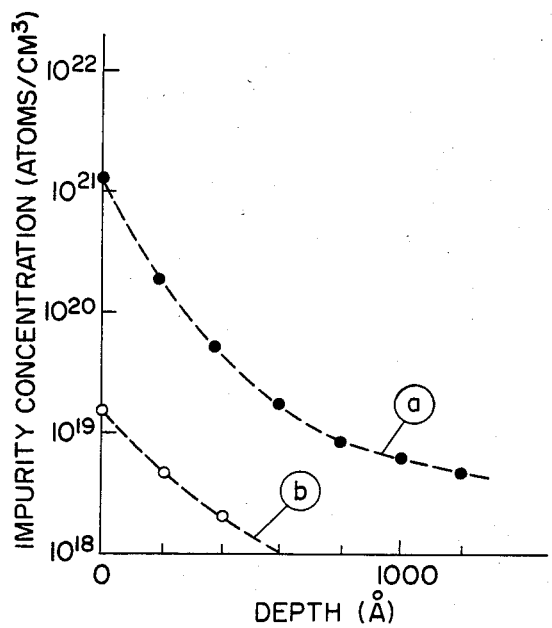
FIG. 2 and FIG. 3 are graphs showing concentrations of diffused impurities in silicon wafers obtained by the diffusion method of this invention.

The extent of diffusion of the phosphorus into the silicon may be studied with the aid of an ion microanalyzer. The results of the test are shown in FIG. 2. In the graph, the depth from the surface of silicon into the interior is represented on the horizontal axis and the phosphorus concentration is represented on the vertical axis. The curve a represents the impurity distribution in a silicon wafer which has been immersed in a solution consisting of phosphoric acid and methyl alcohol in a volume ratio of 10/1000 and thereafter subjected to the aforementioned plasma process for two hours and the curve b represents the impurity distribution in a silicon wafer which has been immersed in a solution of phosphoric acid and methyl alcohol in a volume ratio of 0.01/1000 and thereafter subjected to the plasma process for the same period of time. Since phosphorus is diffused in the silicon wafer as described above, the region diffused by phosphorus exhibits powerful n-type properties.

EXAMPLE 2

As another preferred embodiment, a method for diffusion of boron as an impurity in a silicon wafer will be described.

As the source for the impurity, boric acid is used. The boric acid is diluted in a liquid of high volatility in which it is highly soluble such as, for example, methyl alcohol or pure water in a volume ratio of 0.01/1000 to 10/1000. Then the silicon wafer is immersed in the solution of boric acid and thereafter the wet silicon wafer is dried. Consequently, the alcohol or water is removed by distillation from the solution of boric acid and a fixed quantity of boric acid is deposited on the silicon wafer. By this method, the impurity can be deposited in a prescribed amount on the silicon wafer. For example, a solution containing about 0.06 cc of boric acid is deposited on a silicon wafer 40 mm in diameter and 300 $\mu$m in thickness.

Figure 3:
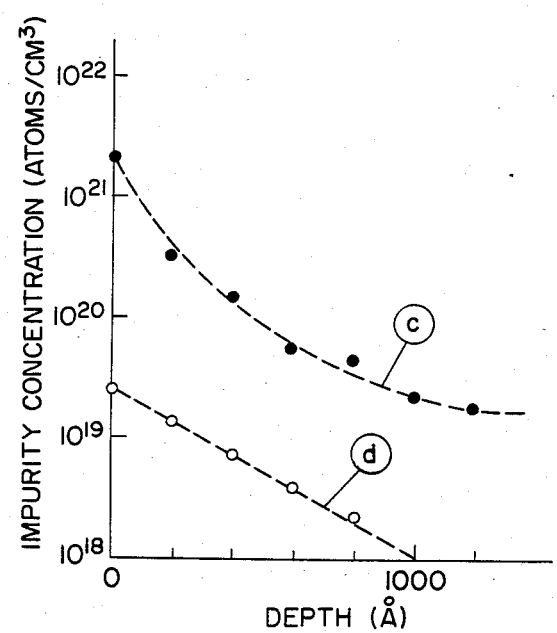

The silicon wafer thus prepared is exposed to argon plasma as described in Example 1 to effect diffusion of boron into the silicon from the surface thereof. The diffusion of boron into the silicon is studied with the aid of an ion microanalyzer. The results of the test are shown in FIG. 3. In the graph, the curves c and d represent the impurity distribution in silicon wafers which have been immersed in solutions consisting of boric acid and methyl alcohol in volume ratios of 10/1000 and 0.01/1000, respectively, and thereafter subjected to the aforementioned plasma process for two hours. The data demonstrate that boron has been diffused in the silicon wafer. Consequently, the regions diffused by boron exhibit powerful p-type properties.

Since all of the processes involved in the present invention are carried out at low temperatures not exceeding 300° C., the invention has the following advantages:

(1) The apparatus to be used for carrying out the method is notably simpler than that used for the conventional thermal diffusion method requiring elevated temperatures exceeding 1000° C.

(2) The duration of the processes involved is shorter.

(3) The method cannot cause any thermal defects in the silicon wafer.

This invention has another salient advantage in that, by suitably varying the concentration of the impurity in the diluting liquid, control of impurity level, i.e., diffusion of the impurity in a desired concentration in the semiconductor substance, can be obtained. Since this method is capable of forming very thin diffused layers (in the neighborhood of 0.1 $\mu$m), which are increasingly in demand, it can be applied to the manufacture of MOS devices and three-dimensional devices.

We claim:

1. A method for diffusion of a desired impurity into a semiconductor substrate, wherein said impurity is capable of acting as a donor or acceptor in a semiconductor, which comprises introducing the impurity into a liquid of high volatility in which the impurity is highly soluble, applying the resultant solution to the semiconductor substrate, drying the semiconductor substrate, and exposing the dried semiconductor substrate to an inactive gas plasma at a temperature less than 300° C., thereby diffusing the impurity into said semiconductor substrate.

2. A method according to claim 1, wherein the impurity acts as an electron donor whereby an n-type semiconductor layer is created by diffusion of the impurity.

3. A method according to claim 2, wherein the impurity is phosphorus.

4. A method according to claim 3, wherein the phosphorus is introduced into the liquid of high volatility in the form of phosphoric acid.

5. A method according to claim 4, wherein the liquid of high volatility is selected from the group consisting of methyl alcohol, ethyl alcohol and water, and phosphoric acid is introduced to said liquid in a volume ratio of from 0.01/1000 to 10/1000.

6. A method according to claim 1, wherein the impurity acts as an electron acceptor whereby a p-type semiconductor layer is created by diffusion of the impurity.

7. A method according to claim 6, wherein the impurity is boron.

8. A method according to claim 7, wherein the boron is introduced into the liquid of high volatility in the form of boric acid.

9. A method according to claim 8, wherein the liquid of high volatility is selected from the group consisting of methyl alcohol and water, and boric acid is introduced to said liquid in volume ratio of from 0.001/1000 to 10/1000.

10. The method of claim 1, wherein the semiconductor substrate is silicon.

11. A method according to claim 10, wherein the impurity acts as an electron donor whereby an n-type semiconductor layer is created by diffusion of the impurity.

12. A method according to claim 11, wherein the impurity is phosphorus.

13. A method according to claim 12, wherein the phosphorus is introduced into the liquid of high volatility in the form of phosphoric acid.

14. A method according to claim 13, wherein the liquid of high volatility is selected from the group consisting of methyl alcohol, ethyl alcohol and water, and phosphoric acid is introduced to said liquid in a volume ratio of from 0.01/1000 to 10/1000.

15. A method according to claim 10, wherein the impurity acts as an electron acceptor whereby a p-type semiconductor layer is created by diffusion of the impurity.

16. A method according to claim 15, wherein the impurity is boron.

17. A method according to claim 16, wherein the boron is introduced into the liquid of high volatility in the form of boric acid.

18. A method according to claim 17, wherein the liquid of high volatility is selected from the group consisting of methyl alcohol and water, and boric acid is introduced to said liquid in volume ratio of from 0.001/1000 to 10/1000.

* * * * *